United States Patent
Wong et al.

(10) Patent No.: US 7,764,129 B1
(45) Date of Patent: Jul. 27, 2010

(54) PHASE-LOCK LOOP STARTUP CIRCUIT AND VOLTAGE CONTROLLED OSCILLATOR REFERENCE GENERATOR

(75) Inventors: Anna Wing Wah Wong, Santa Clara, CA (US); Richard William Swanson, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 63 days.

(21) Appl. No.: 12/338,368

(22) Filed: Dec. 18, 2008

(51) Int. Cl.
*H03L 7/10* (2006.01)
(52) U.S. Cl. .............................. 331/44; 331/16; 331/11
(58) Field of Classification Search ................... 331/44, 331/11, 16
See application file for complete search history.

(56) References Cited

U.S. PATENT DOCUMENTS

| | | | | |
|---|---|---|---|---|
| 5,175,884 A * | 12/1992 | Suarez | ........................ | 455/260 |
| 5,382,922 A * | 1/1995 | Gersbach et al. | ............. | 331/1 A |
| 5,955,928 A * | 9/1999 | Smith et al. | ..................... | 331/2 |
| 6,005,447 A * | 12/1999 | Huang | ......................... | 331/44 |
| 7,154,348 B2 * | 12/2006 | Lee et al. | ....................... | 331/34 |
| 7,295,078 B2 * | 11/2007 | Coppola et al. | ................ | 331/44 |
| 7,688,150 B2 * | 3/2010 | Kurd et al. | ...................... | 331/44 |
| 2008/0136535 A1 * | 6/2008 | Khorram | ...................... | 331/17 |
| 2008/0157884 A1 * | 7/2008 | Lee | .............................. | 331/44 |
| 2009/0042528 A1 * | 2/2009 | Pellerano et al. | ............ | 455/260 |

* cited by examiner

*Primary Examiner*—Joseph Chang
(74) *Attorney, Agent, or Firm*—Kevin T. Cuenot

(57) ABSTRACT

A method of startup for a phase-locked loop (PLL) can include, at initiation of the PLL, providing a reference voltage from a startup voltage source to an input of a voltage controlled oscillator (VCO) in the PLL, wherein the reference voltage is set to a predetermined minimum voltage. The reference voltage can be stepwise increased from the predetermined minimum voltage. A frequency of a reference signal input to the PLL can be compared with a frequency of a feedback signal originating from an output of the VCO of the PLL to determine a frequency differential as the reference voltage increases. A determination can be made as to whether a convergence criterion is met according to the frequency differential. While the convergence criterion is not met, the reference voltage can be increased. When the convergence criterion is met, the reference voltage provided by the startup voltage source can be replaced with a voltage generated by an operational voltage source.

20 Claims, 6 Drawing Sheets

US 7,764,129 B1

PHASE-LOCK LOOP STARTUP CIRCUIT AND VOLTAGE CONTROLLED OSCILLATOR REFERENCE GENERATOR

FIELD OF THE INVENTION

The embodiments disclosed herein relate to phase-locked loops (PLLs). More particularly, the embodiments relate to PLL startup and maintaining a voltage controlled oscillator (VCO) output upon a loss of a reference signal to the PLL.

BACKGROUND

Phase-locked loops (PLLs) are a common circuit block implemented within various electrical systems. Providing the ability to generate output frequencies in multiples of a fixed reference frequency, PLLs are widely used in telecommunication circuits, radio systems, and microprocessors, as well as other electronic systems. The output signal from the PLL, for example, can be provided to various types of circuits to implement clock recovery circuits, frequency synthesis circuits whether for modulators and/or de-modulators, on-board system clocks, clock distribution circuits, and various other circuits that generate or rely upon a frequency controlled signal.

In general, PLLs are composed of four blocks. These blocks include a voltage controlled oscillator (VCO), a phase frequency detector (PFD), a loop filter, and a closed loop negative feedback path from the VCO to the PFD. Typically, the PFD compares a phase and frequency of a feedback signal output from the VCO with a fixed frequency reference signal provided to the PLL. The PFD and loop filter convert the frequency and phase differences between the feedback VCO signal and the fixed frequency reference signal to an output voltage. The output voltage can then be used to control the frequency of the signal output from the VCO. Using phase and frequency error information, the PFD adjusts the control voltage of the VCO, thereby changing the frequency of the signal output from the VCO until the phase and frequency of the VCO output signal and the reference clock signal are matched.

There are a variety of design issues to consider when implementing a PLL. PLL startup time and PLL stability are often important aspects of a PLL design, particularly since PLLs are closed loop feedback systems. The importance of any individual PLL design parameter will likely vary according to the particular application in which the PLL is used. As such, the PLL often must meet stringent performance parameters, e.g., output frequency, noise and jitter specifications, spur reduction, and the like, for effective operation within the larger system. Each block of the PLL is often constrained to operate within a particular range to ensure acceptable performance of the PLL as a whole.

The interdependence among design parameters of the PLL can complicate the development of a successful PLL design. Performance improvement in a particular parameter of the PLL design, e.g., to improve startup time or stability, often leads to performance degradation in one or more other aspects of the PLL design. In many cases, it becomes necessary to prioritize parameters, sacrificing performance in one design parameter to meet a performance requirement for another design parameter of greater importance.

SUMMARY

The embodiments disclosed herein relate to phase-locked loops (PLLs) and, more particularly, to PLL startup and maintaining a voltage controlled oscillator (VCO) output upon a loss of a reference signal to the PLL. One embodiment of the present invention can include a method of startup for a PLL. The method can include, at initiation of the PLL, providing a reference voltage from a startup voltage source to an input of a VCO in the PLL, wherein the reference voltage is set to a predetermined minimum voltage, and stepwise increasing the reference voltage from the predetermined minimum voltage. A frequency of a reference signal input to the PLL can be compared with a frequency of a feedback signal originating from an output of the VCO of the PLL to determine a frequency differential as the reference voltage increases. A determination can be made as to whether a convergence criterion is met according to the frequency differential. While the convergence criterion is not met, the reference voltage can be increased. When the convergence criterion is met, the reference voltage provided by the startup voltage source can be replaced with an operational voltage generated by an operational voltage source.

Providing the reference voltage from the startup voltage source can include operationally disconnecting an output of the operational voltage source from the input of the VCO and operationally connecting an output of the startup voltage source to the input of the VCO.

The method can include determining that the convergence criterion is not met responsive to detecting at least two consecutive transition edges of the reference signal without detecting an intervening transition edge of the feedback signal. A determination can be made that the convergence criterion has been met when transition edges of the reference signal and the feedback signal alternate for two consecutive periods of the reference signal.

Replacing the reference voltage provided by the startup voltage source with the operational voltage generated by the operational voltage source can include operationally disconnecting an output of the startup voltage source from the input of the VCO and operationally connecting an output of the operational voltage source to the input of the VCO.

When the PLL is in phase and frequency lock, the method can include comparing the operational voltage at the input of the VCO with the reference voltage, wherein the reference voltage is set to the predetermined minimum voltage, and dynamically stepwise adjusting the reference voltage in increments of a predetermined quantity of voltage according to the comparing of the operational voltage with the reference voltage. A counter value representing the reference voltage occurring immediately prior to the reference voltage being stepwise adjusted to exceed the operational voltage can be stored in memory.

The method further can include, responsive to detecting a loss of the reference signal to the PLL, recalling the counter value from memory, setting the reference voltage to a voltage level indicated by the recalled counter value, and replacing the operational voltage provided to the input of the VCO with the reference voltage.

Another embodiment of the present invention can include a PLL system including a VCO and a voltage reference generator. The voltage reference generator can include a reference voltage source that, at initiation of the PLL system, generates a reference voltage set to a predetermined minimum voltage that is provided to an input of the VCO in the PLL system. The reference voltage generator further can include a controller that stepwise increases the reference voltage of the reference voltage source, compares a frequency of a reference signal provided to the PLL system with a frequency of a feedback signal originating from an output of the VCO, calculates a frequency differential between the reference signal and the feedback signal as the reference voltage increases, and determines whether a convergence criterion is met according to the frequency differential. When the convergence criterion is met, the controller disconnects the reference voltage source from the input of the VCO and connects an operational voltage source to the input of the VCO.

At startup of the PLL system, the controller can open a feedback loop of the PLL system by connecting the reference voltage source to the input of the VCO in lieu of the operational voltage source. For example, the controller can operationally disconnect an output of the operational voltage source from the input of the VCO and operationally connect an output of the reference voltage generator to the input of the VCO.

The controller can include a counter providing a control signal to the reference voltage source controlling the reference voltage output from the reference voltage source, and a logic block periodically incrementing the counter, thereby stepwise increasing the reference voltage.

The controller can determine that the convergence criterion is not met when two consecutive transition edges are detected in the reference signal without detecting an intervening transition edge in the feedback signal. The controller can determine that the convergence criterion is met when transition edges of the reference signal and the feedback signal alternate for two consecutive periods of the reference signal.

Another embodiment of the present invention can include a PLL system having an operational voltage source that generates an operational voltage that is provided to an input of a VCO of the PLL system during phase and frequency lock of the PLL system and a reference voltage source generating a reference voltage. The PLL system also can include a controller that, while the PLL system is in phase and frequency lock, determines whether a reference signal to the PLL system is available and controls the reference voltage source to generate the reference voltage, thereby approximating the operational voltage from the operational voltage source. The controller can selectively store count values, indicating the reference voltage, in memory. Responsive to determining that the reference signal is unavailable, the controller can operationally disconnect the operational voltage source from the input of the VCO, recall the count value from memory, control the reference voltage source to generate the reference voltage having a voltage corresponding to the recalled count value, and operationally connect the reference voltage source to the input of the VCO.

Responsive to determining that the reference signal is available, the controller can operationally disconnect the reference voltage source from the input of the VCO and operationally connect the operational voltage source to the input of the VCO.

Responsive to determining that the reference signal is unavailable, the controller can open a feedback loop of the PLL system by connecting the reference voltage source to the input of the VCO in lieu of the operational voltage source.

The controller can include a comparator that compares the operational voltage generated by the operational voltage source at the input of the VCO during phase and frequency lock of the PLL system with the reference voltage generated by the reference voltage source. The controller also can include a logic block and a counter that maintains the count value. Responsive to a comparison signal generated by the comparator, the logic block can decrement the count value of the counter when the reference voltage exceeds the operational voltage and increment the count value of the counter when the operational voltage exceeds the reference voltage. The counter can output a control signal causing the reference voltage source to increase the reference voltage or decrease the reference voltage according to the count value.

The controller, responsive to determining that the reference voltage has transitioned from a first voltage level less than the operational voltage to a second voltage level exceeding the operational voltage, stores the count value corresponding to the first voltage level in memory.

DETAILED DESCRIPTION OF THE DRAWINGS

Figure 1:
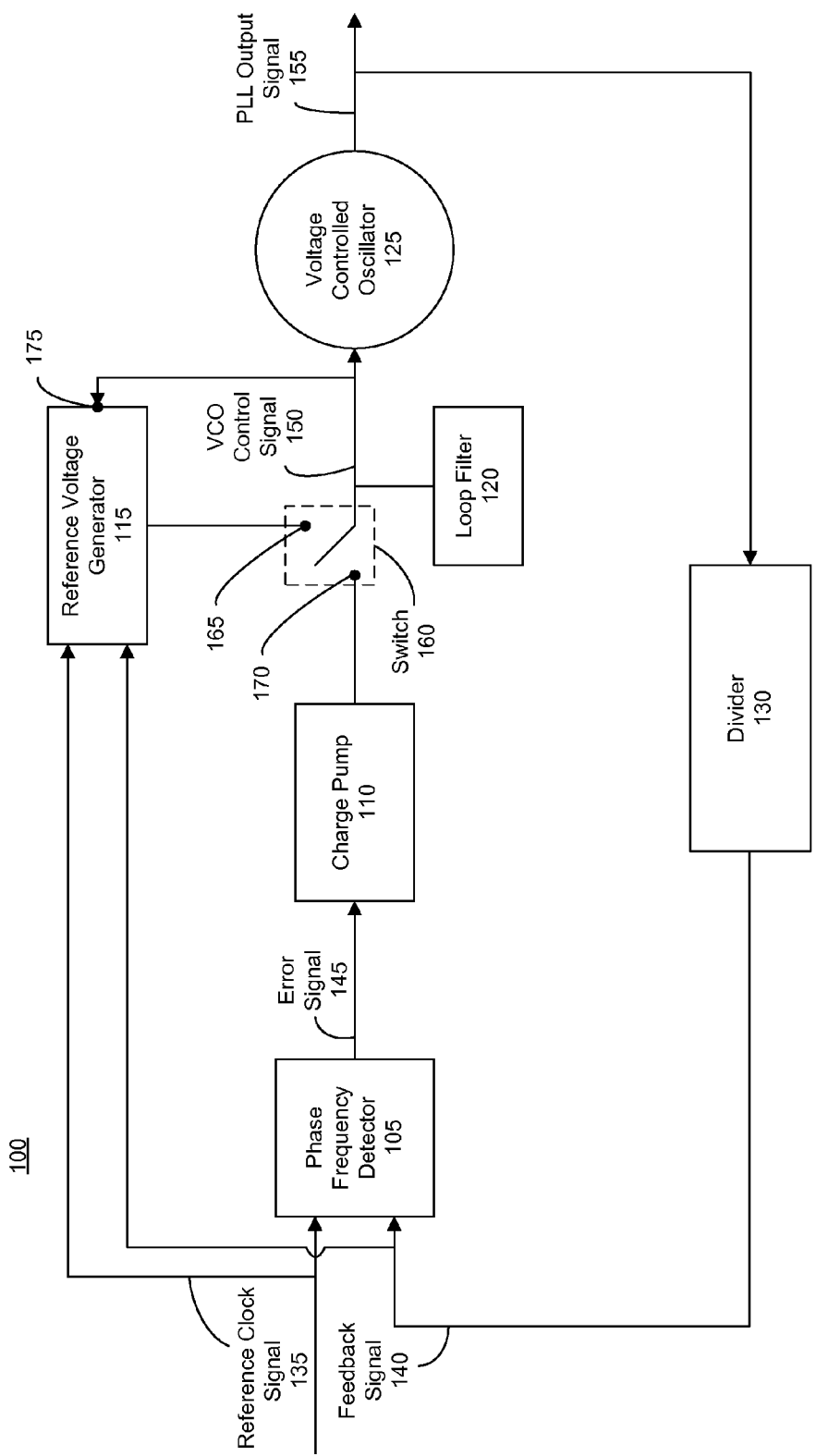
FIG. 1 is a first block diagram illustrating a phase-locked loop (PLL) system in accordance with one embodiment of the present invention.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the invention.

The embodiments disclosed herein relate to phase-locked loops (PLLs), and more particularly, to a PLL with improved startup characteristics. In accordance with the inventive arrangements disclosed herein, the feedback loop of a PLL can be opened at PLL startup and a startup reference voltage can be applied to the input of a voltage controlled oscillator (VCO) of the PLL. While monitoring a frequency differential between a reference signal and a feedback signal originating from the VCO, the startup reference voltage can be increased until the frequency differential between the feedback signal and the reference signal meets a convergence criterion. With the convergence criterion met, the startup reference voltage can be removed, the PLL feedback loop closed, and the PLL returned to normal closed loop operation. This approach improves startup characteristics of the PLL, because with the feedback loop open, startup is no longer limited by design and performance characteristics of the PLL, e.g., loop bandwidth, charge pump gain, VCO gain, or the like. In this manner, the voltage at the input of the VCO can be increased at a faster rate than is achievable with a typical charge pump implemented within the PLL.

Other techniques seek to improve PLL startup by opening the PLL loop and applying a fixed voltage to the VCO input. The fixed voltage approximates the expected voltage seen at the VCO input in a particular phase and frequency locked state. These approaches, however, can be limited to a particular frequency operating range of the VCO and the PLL. The dynamic control implemented within the embodiments disclosed within this specification provides a flexible operating range, as the startup reference voltage can be adjusted incrementally across a voltage range supplying the PLL system. This flexibility can be useful in applications implemented with programmable integrated circuits (ICs), for example, where the ICs may be used in a variety of applications, making it desirable to have a startup approach that is functional over a variety of different PLL operating ranges.

In another aspect, after startup, when the PLL has achieved phase and frequency lock, a controller can monitor the reference signal while storing a value that approximates the voltage level applied to the input of the VCO of the PLL. Responsive to the PLL losing the reference signal, the stored value can be recalled and used to generate a voltage that can be applied to an input of the VCO. This allows the VCO to continue outputting a signal having a frequency that is an approximation of the frequency of the signal output from the VCO immediately prior to loss of the reference signal. Upon the return of the reference signal, normal PLL operation can continue. In this manner, the PLL can continue to provide an output signal during a period of time in which the reference signal is lost or unavailable. Accordingly, a system driven by the PLL can continue uninterrupted operation despite the temporary loss of the reference signal.

The embodiments disclosed within this specification can be implemented within a variety of different types of ICs, whether custom ICs, application specific integrated circuits (ASICs), mixed signal ICs, or programmable ICs. Programmable ICs are a type of IC that can be programmed to perform specified logic functions. Examples of programmable ICs can include, for example, field programmable gate arrays (FPGAs), Complex Programmable Logic Devices (CPLDs), Programmable Logic Arrays (PLAs), and Programmable Array Logic (PAL) devices.

Within these devices, the functionality of the device can be controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other examples of programmable ICs can include those programmed by applying a processing layer, such as a metal layer, that programmably interconnects the various elements on the device. These programmable ICs are known as mask programmable devices. Programmable ICs can also be implemented in other ways, e.g., using fuse or antifuse technology.

The phrase "programmable IC," as used within this specification, can include, but is not limited to, these devices, as well as encompassing devices that are only partially programmable. For example, one type of programmable IC can include a combination of hard-coded transistor logic and a programmable switch fabric that programmably interconnects the hard-coded transistor logic.

FIG. 1 is a first block diagram illustrating a PLL system 100 in accordance with one embodiment of the present invention. PLL system 100 can include a phase frequency detector (PFD) 105, a charge pump 110, a reference voltage generator 115, a loop filter 120, a VCO 125, and a divider 130, coupled together as shown in FIG. 1. Like numbers are used to refer to the same components throughout this specification. Further, the same reference characters are used to refer to terminals, signal lines, wires, nodes, and their corresponding signals. In this regard, the terms "signal," "wire," "connection," "terminal," "node," and "pin" may be used interchangeably, from time to time, within the this specification.

PFD 105 can receive two input signals, e.g., reference clock signal 135 and feedback signal 140, compare the phase and frequency of the two signals, and output error signal 145. Error signal 145 is representative of the frequency and phase difference between reference clock signal 135 and feedback signal 140. PFD 105 can be implemented as any of a variety of circuits. For example, PFD 105 can be implemented as an analog multiplier or mixer circuit, a simple logic circuit, e.g., sample and hold or exclusive-OR logic, a flip-flop based phase detector, a zero dead zone phase detector, or the like. The various PFD implementations disclosed within this specification are provided for purposes of illustration only and, as such, are not intended to limit the embodiments of the present invention.

Charge pump 110 can include a current source and a current sink. The current source and current sink can be enabled independently of one another. That is, either the current source or the current sink may be individually enabled or both the current source and the current sink may operate concurrently. In typical PLL operation, charge pump 110 will source or sink a variable length pulse of a fixed quantity of constant current. Charge pump 110 can be implemented as any of a variety of circuits. For example, charge pump 110 can be implemented as a gate switching charge pump, a source switching charge pump, a current steering charge pump, or the like. The various charge pump implementations described within this specification are provided for purposes of illustration only and are not intended to limit the PLL system 100 to any particular type of charge pump. Charge pump 110 can be selectively disconnected from PLL system 100, as will be described within this specification in greater detail.

As used herein, "disconnecting" or "disconnected" can refer to any of a number of techniques used to operationally disconnect or electrically isolate an electrical node or circuit block from another electrical node or circuit block. For example, opening a switch can separate two electrical nodes in a circuit. In another example, an output node of a first circuit block can be rendered a high impedance node. A second circuit block connected to the high impedance node would effectively see the high impedance node as an open circuit, thereby functionally disconnecting the first circuit block from the second circuit block.

Reference voltage generator 115 can perform several functions. In one aspect, during startup of the PLL system 100, reference voltage generator 115 can act as a startup voltage source that internally generates a reference voltage that can be provided to the input of VCO 125 in the form of VCO control signal 150. In that case, reference voltage generator 115 can set the state of switch 160 to connect node 165, representing an output of reference voltage generator 115, to the input of VCO 125. This disconnects the output of charge pump 110, e.g., node 170, from VCO 125.

Reference voltage generator 115 then can stepwise increase the voltage level of VCO control signal 150, now provided by reference voltage generator 115 in lieu of charge pump 110, from a predetermined minimum voltage, which serves as a starting voltage for VCO 125. Reference voltage generator 115 can compare the frequencies of reference clock signal 135 and feedback signal 140 and determine whether the frequency differential meets a convergence criterion. Responsive to that determination, reference voltage generator 115 can selectively change the state of switch 160 to keep charge pump 110 disconnected or reconnect charge pump 110 to VCO 125.

When the convergence criterion is met, switch 160 can change state to connect node 170, representing the output of charge pump 110, with VCO 125. In a second aspect, during phase and frequency lock, reference voltage generator 115 can be alerted to a loss of reference clock signal 135. Via input port 175, reference voltage generator 115 further can monitor VCO control signal 150, now provided by charge pump 110. Reference voltage generator 115 can compare VCO control signal 150 to an internally generated reference voltage and adjust the internally generated reference voltage. The internally generated reference voltage can be continually increased or decreased by a predetermined quantity of voltage to approximate the voltage level of VCO control signal 150.

Reference voltage generator 115 can store, within memory, a value indicating the internally generated reference voltage during operation. As noted, the value stored will indicate a voltage that is close to, if not the same as, the voltage of VCO control signal 150. When reference clock signal 135 is lost, voltage reference generator 115 can change the state of switch 160 to connect node 165 to the input of VCO 125. Reference voltage generator 115 can recall the stored value specifying the internally generated reference voltage from memory and generate the voltage indicated by the stored value. The generated voltage can be provided to the input of VCO 125 in the form of VCO control signal 150. Further description of the structure and functionality of reference voltage generator 115 are provided throughout this specification.

Loop filter 120 can control the bandwidth of the PLL feedback loop. As such, loop filter 120 influences a number of PLL performance parameters including startup time, loop response to a step input, noise bandwidth of PLL system 100, reference spur rejection at the PLL output, e.g., PLL output signal 155, and the like. Loop filter 120 can vary in structure as well as filter order and, as such, may be implemented as a shunt connection to the input of VCO 125, as shown in FIG. 1, or as a series element connected between node 170 and the input of VCO 125.

As a result of the varied structure of loop filter 120, the output of charge pump 110 and the input of VCO 125 may be a single node, e.g., when loop filter 120 is shunt connected, or two separate nodes, e.g., when loop filter 120 is series connected. In the case of two separate nodes, the typically high input impedance of VCO 125 can result in the steady state voltage at node 170 being approximately equal to the voltage at the input of VCO 125. This facilitates analysis and treatment of the two nodes as a single node.

VCO 125 can receive a DC voltage in the form of VCO control signal 150 and convert the DC voltage to a periodic output signal in the form of PLL output signal 155, representing the output of PLL system 100. The DC voltage level of VCO control signal 150 determines the output frequency of PLL output signal 155. The voltage to frequency gain of VCO 125 can be positive or negative, depending upon the gain of other components in PLL system 100. Generally, VCO 125 can be implemented as a harmonic or relaxation oscillator. Examples of different oscillators that may be used can include ring oscillators, resonator based oscillators such as LC tank or varactor oscillators, astable multi-vibrators, crystal oscillators, or the like. The various VCO implementations described within this specification are provided for purposes of illustration only and are not intended to limit the PLL system 100 to any particular type of VCO.

Divider 130 may optionally be included in PLL system 100. In general, divider 130 can be included in any PLL implementation in which the desired frequency of PLL output signal 155 is a frequency multiple of reference clock signal 135. When the intended frequency of PLL output signal 155 is equal to the frequency of reference clock signal 135, divider 130 may be omitted. Divider 130 receives an input signal and outputs a signal having a frequency that is the frequency of the input signal divided by N, where N is a predetermined integer that is greater than one. For example, when the input signal has a frequency of 1 MHz and N is equal to 10, feedback signal 140, which is the output from divider 130, has a frequency of 100 KHz. Divider 130 can be implemented as a fixed divider, or, in the case of a frequency synthesizer, a programmable or multi-mode divider, e.g., a dual modulus divider.

Operation of PLL system 100 can begin in a startup phase with reference voltage generator 115 disconnecting node 170 from the input of VCO 125 and connecting node 165 to the input of VCO 125 via switch 160. As used herein, "startup" can refer to any occurrence of initializing the operation of PLL system 100 from a powered down state. For example, startup can include the initial power up of PLL system 100, recovering from an interruption of power to PLL system 100, powering on after disabling a block of a circuit containing PLL system 100, or the like. Although implemented as switch 160 in PLL system 100, the connecting and disconnecting functions of PLL system 100 can be implemented as a variety of different circuits. As such, switch 160 is not meant to limit PLL system 100 to any particular type of switch. Though not shown, switch 160 may be controlled via reference voltage generator 115.

It should be noted that positioning switch 160 to connect node 165, thereby disconnecting charge pump 110 from the input of VCO 125, opens the feedback loop of PLL system 100. Opening the feedback loop prevents PFD 105 and charge pump 110 from generating VCO control signal 150. In this mode, PFD 105 and charge pump 110 surrender control of VCO 125 to reference voltage generator 115. Further, as noted, the state or position of switch 160 determines whether VCO control signal 150 is generated by charge pump 110 or reference voltage generator 115. As such, "changing the state" of switch 160 implies disconnecting one circuit block of either charge pump 110 or reference voltage generator 115 from PLL system 100, and connecting the alternate circuit block to PLL system 100.

Once switch 160 disconnects charge pump 110, reference voltage generator 115 can apply a reference voltage to the input of VCO 125 as VCO control signal 150. The reference voltage initially can be set to a minimum voltage level. Reference voltage generator 115 can incrementally increase the voltage level of VCO control signal 150, thereby increasing the frequency of PLL output signal 155.

Reference voltage generator 115 can dynamically compare the frequency differential between reference clock signal 135 and feedback signal 140 as the voltage of VCO control signal 150 is increased. Responsive to reference voltage generator 115 determining that the frequency differential has met a convergence criterion, reference voltage generator 115 can change the state of switch 160. The state change in switch 160 closes the PLL feedback loop and results in charge pump 110 supplying VCO control signal 150 in lieu of reference voltage generator 115.

Within conventional PLLs, the speed at which the PLL acquires phase and frequency lock can be limited by factors such as the bandwidth of loop filter 120, the rate of current output by charge pump 110, and the voltage to frequency conversion gain of VCO 125. These limitations to startup speed may be unavoidable, as other design specifications of the PLL can prevent changes to system parameters that improve startup time. For example, increasing the bandwidth of loop filter 120 can improve the startup time of PLL system 100, however, doing so will decrease the rejection of reference clock spurs. The decreased reference clock spur performance can render a PLL unusable for particular applications. As the disclosed embodiments offer a startup approach that operates with the PLL feedback loop open, the startup performance of PLL system 100 is not affected by performance capabilities of a closed loop system. The disclosed embodiments provide a startup approach that can improve PLL startup independently of the design of the PLL feedback loop of PLL system 100.

With the convergence criterion met and charge pump 110 connected to VCO 125, PLL system 100 can begin normal operation. Meeting the convergence criterion assures that feedback signal 140 starts operation at a frequency that is less than the frequency of reference clock signal 135. PFD 105 can compare the frequency of reference clock signal 135 and the frequency of feedback signal 140 by detecting a selected transition edge, e.g., a rising edge, occurring within each signal. Note that throughout this specification, the embodiments are described using positive logic, where a high voltage enables a function or a block of the circuit. It should be appreciated, however, that the embodiments may be implemented with negative logic or a combination of both positive and negative logic.

When PFD 105 detects the selected edge occurring first in reference clock signal 135, error signal 145 can cause charge pump 110 to begin sourcing. VCO control signal 150 will, therefore, source current to VCO 125. Node 170 can provide a predetermined level of constant current. While the format of error signal 145 may differ for each different PFD implementation, in each format, error signal 145 can contain the phase and frequency error information necessary for controlling operation of charge pump 110. That is, charge pump 110 will source current, sink current, or concurrently source and sink current responsive to error signal 145. For example, a flip-flop based phase detector can output voltage pulses of varying width, while a mixer based phase detector can output a DC voltage level. It should be noted that in certain PLL implementations, error signal 145 from PFD 105 can be transmitted directly from PFD 105 to loop filter 120. In such cases, charge pump 110 is not required as a functional block.

As charge pump 110 sources current to loop filter 120, VCO control signal 150 can increase in voltage, thereby increasing the frequency of PLL output signal 155. PLL output signal 155 can be provided to divider 130. Divider 130, in turn, outputs feedback signal 140. The frequency of feedback signal 140 can be the frequency of PLL output signal 155 divided by N, wherein N is the division ratio of divider 130. PFD 105 receives feedback signal 140, thereby creating the negative feedback loop in PLL system 100.

The negative feedback of the loop is characterized by the fact that as the frequency of PLL output signal 155 increases, the frequency of feedback signal 140 increases, and the number of transition edges input to PFD 105 by feedback signal 140 increases. The increase in number of transition edges per unit time of feedback signal 140 causes PFD 105 to generate error signal 145 that instructs charge pump 110 to source less current to loop filter 120. The reduction in current to loop filter 120 reduces the rate of voltage increase in VCO control signal 150, until the frequency of feedback signal 140 exceeds the frequency of reference clock signal 135. Accordingly, PFD 105 can direct charge pump 110 to begin sinking current from loop filter 120, thereby decreasing the voltage of VCO control signal 150 and decreasing the frequency of feedback signal 140. In this manner, the loop can continue converging the frequency of feedback signal 140 to the frequency of reference clock signal 135 until PLL system 100 achieves phase and frequency lock.

In a second phase of operation, after PLL system 100 has achieved phase and frequency lock, reference voltage generator 115 can begin monitoring VCO control signal 150 through input port 175. While monitoring, the state of switch 160 remains unchanged where charge pump 110 provides VCO control signal 150 to VCO 125. Reference voltage generator 115 can store a value indicating the internally generated voltage level that approximates and tracks the voltage level of VCO control signal 150. Having stored that value, reference voltage generator 115 can continue to monitor VCO control signal 150. As VCO control signal 150 may shift over time, e.g., with changes in temperature, reference voltage generator 115 can store new values corresponding to further approximations of the voltage of VCO control signal 150 over time. This process is described below in further detail.

Responsive to reference voltage generator 115 being alerted to a loss of reference clock signal 135, reference voltage generator 115 can change the state of switch 160 so that node 165 is connected to VCO 125. Accordingly, reference voltage generator 115 provides VCO control signal 150 to the input of VCO 125. Reference voltage generator 115 can recall the last stored value corresponding to the internally generated reference voltage and apply that voltage to the input of VCO 125 as VCO control signal 150. Within conventional PLL systems, the loss of reference clock signal 135 would cause the PLL to lose phase and frequency lock and provide an unstable output signal. With respect to the embodiments disclosed within this specification, recalling the last stored value indicating a voltage to be applied to the input of VCO 125 as described allows PLL system 100 to continue providing PLL output signal 155 with a nearly constant frequency despite the loss of reference clock signal 135.

When reference voltage generator 115 is alerted to the return of reference clock signal 135, reference voltage generator 115 can alter the state of switch 160, allowing charge pump 110 to provide VCO control signal 150 to VCO 125. At this point, reference voltage generator 115 will return to monitoring VCO control signal 150 through port 175. With the feedback loop closed, PLL system 100 can return to normal closed loop operation.

Figure 2:
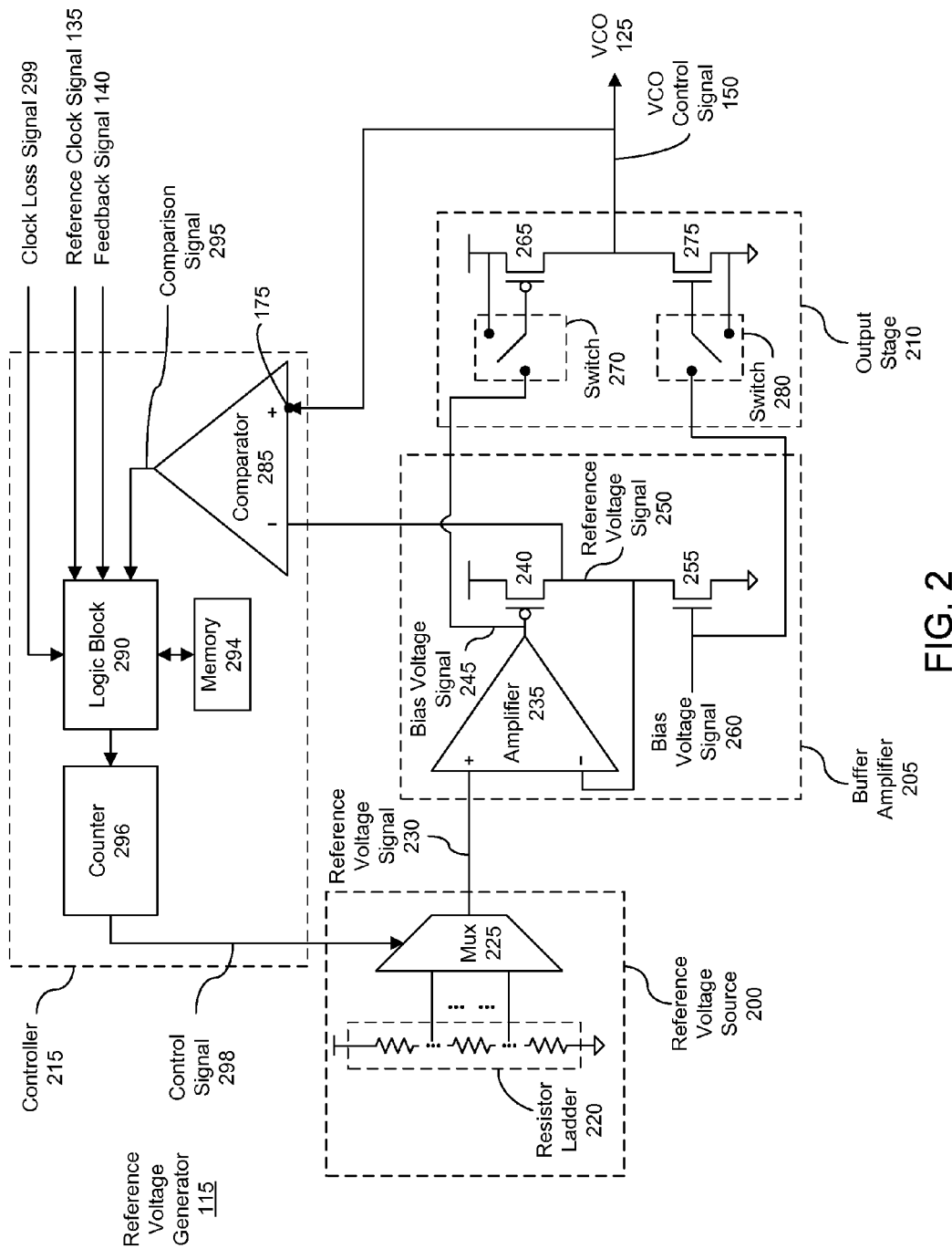
FIG. 2 is a second block diagram illustrating a reference voltage generator for use with the PLL system of FIG. 1 in accordance with another embodiment of the present invention.

FIG. 2 is a second block diagram illustrating the reference voltage generator 115 of FIG. 1, in accordance with another embodiment of the present invention. As shown, reference voltage generator 115 can include a reference voltage source 200, a buffer amplifier 205, an output stage 210, and a controller 215, coupled together as shown in FIG. 2.

Reference voltage source 200 can include a resistor ladder 220 and a multiplexer (Mux) 225. Resistor ladder 220 can include multiple series-connected resistors connected between two differing voltage potentials available within the circuit. In one embodiment, each resistor can have a same resistive value. As each resistor has the same resistive value, the voltage drop across each resistor is approximately equal to the voltage drop across each other resistor. In addition, the quantity of the voltage drop across each resistor will be equal to a predetermined amount of incremental voltage change, e.g. one step, of reference voltage signal 230. A node between each series-connected resistor of resistor ladder 220 can be connected to multiplexer 225 as an input. Accordingly, passing each successive input through multiplexer 225 can result in reference voltage signal 230 stepwise increasing in voltage, where each step is equal to the predetermined amount of incremental voltage change corresponding to the voltage drop across one resistor in resistor ladder 220. Multiplexer 225 can receive control signal 298, which may be a multi-bit value. Responsive to control signal 298, multiplexer 225 can determine the particular input from resistive ladder 220 to pass as reference voltage signal 230.

Buffer amplifier 205 can include an amplifier 235, a PMOS transistor (PMOS) 240, and an NMOS transistor (NMOS) 255, coupled together as shown in FIG. 2. Amplifier 235 can be implemented as any of a variety of differential amplifier circuits that can receive a differential signal to a positive input and a negative input, and output a single-ended signal. The output of amplifier 235 can be connected to the gate of PMOS 240, thereby providing bias voltage signal 245 to PMOS 240. As such, PMOS 240 can provide a second stage of amplification with the drain of PMOS 240, corresponding to reference voltage signal 250, being the output node of the second stage amplifier. Connecting the drain of PMOS 240 to the negative input of amplifier 235 creates a negative feedback loop. The negative feedback loop is formed by the path beginning at the output of amplifier 235, continuing to the gate of PMOS 240 and back to the negative input of amplifier 235.

As a block, amplifier 235 and PMOS 240 can operate as a unity gain buffer effectively reproducing the voltage seen at the positive input of amplifier 235 as an output voltage at the drain of PMOS 240. Thus, reference voltage signal 250 can be equal to, or approximate, reference voltage signal 230, with PMOS 240 operating as an output stage for buffer amplifier 205. NMOS 255, having a drain connected to the drain of PMOS 240, can determine the bias current level for the output stage of buffer amplifier 205. The bias current level is dependent upon the bias voltage applied at the gate of NMOS 255, e.g., bias voltage signal 260.

Although the present embodiment is illustrated using MOSFET transistors, a variety of transistor types can be used, e.g., junction transistors, field effect transistors, a combination of transistor types, or the like. Those skilled in the art will appreciate that although each transistor type has a distinct set of connection node names, the different transistor types have an analogous set of connection points with which the circuit architecture of the present embodiment can be implemented. As such, the particular type of transistor used is not intended to limit the embodiments disclosed within this specification.

Output stage 210 can include PMOS 265, NMOS 275, switch 270, and switch 280, coupled together as shown in FIG. 2. PMOS 265 can be of a same device type and size as PMOS 240. Switch 270 can connect the gate of PMOS 265 to bias voltage signal 245 or connect the gate of PMOS 265 to the source of PMOS 265. When switch 270 connects the gate and source of PMOS 265, PMOS 265 is disabled. In addition, NMOS 275 can be of a same device type and size as NMOS 255. Switch 280 can connect the gate of NMOS 275 to bias voltage signal 260 or connect the gate of NMOS 275 to the source of NMOS 275. When switch 280 connects the gate and source of NMOS 275, NMOS 275 is disabled.

PMOS 265 and NMOS 275 together output VCO control signal 150. Although each of switches 270 and 280 is depicted as a two pole switch, switches 270 and 280 can be implemented in a variety of forms. As such, the particular circuits used to connect and disconnect output stage 210 are not intended to limit the embodiments described within this specification. In one embodiment, output stage 210 can, at least in part, can function as, or implement, switch 160 of FIG. 1. When PMOS 265 and NMOS 275 are disabled, the reference voltage generator 115 does not provide VCO control signal 150 to the input of VCO 125.

Controller 215 can include a comparator 285, a logic block 290, a memory 294, and a counter 296, coupled together as shown in FIG. 2. Operation of reference voltage generator 115 can begin in a startup phase, with charge pump 110 (not shown) of PLL system 100 described in FIG. 1 being disconnected from PLL system 100. Additionally, switch 270 can connect bias voltage signal 245 to the gate of PMOS 265 and switch 280 can connect bias voltage signal 260 to the gate of NMOS 275. Accordingly, output stage 210 is enabled and generates VCO control signal 150 to VCO 125.

Logic block 290 can begin comparing reference clock signal 135 with feedback signal 140 to determine the frequency differential. Logic block 290 can be implemented with digital logic circuits, a processor, or using the programmable fabric of a programmable IC, for example. At startup of PLL system 100, logic block 290 can reset counter 296 to a minimum value. Counter 296 can output a series of bits, e.g., control signal 298, which can be used to control multiplexer 225. Counter 296 generates control signal 298 which instructs multiplexer 225 to initially output a predetermined minimum voltage as reference voltage signal 230. Control signal 298 can select the appropriate input to multiplexer 225 from resistor ladder 220 to generate the minimum value of the startup reference voltage. The startup reference voltage can be output from multiplexer 225 as reference voltage signal 230.

As buffer amplifier 205 can be a unity gain amplifier, the voltage of reference voltage signal 250 can be approximately equal to the voltage of reference voltage signal 230. In addition, PMOS 240 and PMOS 265 can be identical devices, each biased with a same gate voltage, e.g. bias voltage signal 245, and source voltage. NMOS 255 and NMOS 275 can be identical devices, each being biased with a same gate voltage, e.g., bias voltage signal 260, and source voltage. Accordingly, as the output stage of buffer amplifier 205 and output stage 210 are implemented with matching architectures, devices, and biasing, reference voltage signal 250 should be approximately equal to VCO control signal 150. With output stage 210 generating VCO control signal 150, PMOS 265 and NMOS 275 can source current to, or sink current from, VCO 125 until the voltage of VCO control signal 150, in steady state, is approximately equal to the voltage of reference voltage signal 250.

Subsequent to VCO control signal 150 settling, logic block 290 can determine whether a frequency differential between reference clock signal 135 and feedback signal 140 meets a convergence criterion. As illustrated in FIG. 1, feedback signal 140 can be taken from the output of VCO 125 after passing through optional divider 130. When the convergence criterion is not met, logic block 290 can increment a count stored within counter 296. Counter 296 outputs control signal 298, which is indicative of the incremented count, thereby causing multiplexer 225 to pass the next higher node of resistive ladder 220. This increases reference voltage signal 230, reference voltage signal 250, and VCO control signal 150. Logic block 290 can continue monitoring the frequency differential between reference clock signal 135 and feedback signal 140.

When the convergence criterion is met, logic block 290 can disable output stage 210. Further, logic block 290 can connect charge pump 110 to the input of VCO 125 and allow the PLL to achieve phase and frequency lock. Though not shown, controller 215 can generate control signals necessary to open and close switches within reference voltage generator 115. For example, switches 270 and 280 can receive control signals from controller 215 directing switches 270 and 280 to enable and/or disable output stage 210.

With PLL system 100 having achieved phase and frequency lock, reference voltage generator 115 can begin a second phase of operation. In the second phase of operation, logic block 290 can set reference voltage signal 230 to the predetermined minimum voltage and begin monitoring clock loss signal 299 for the loss of reference clock signal 135. Clock loss signal 299 can provide a logic signal to the reference voltage generator 115 identifying the occurrence of a loss of reference clock signal 135 to PLL system 100. For example, the count within counter 296 can be reset to a minimum value. Accordingly, reference voltage signal 250 can be set to the predetermined minimum voltage. In the second phase of operation, however, output stage 210 can be disabled, thereby disconnecting output stage 210 from the input of VCO 125. Accordingly, charge pump 110 provides VCO control signal 150 to VCO 125 in lieu of output stage 210.

Comparator 285 can receive two input signals, compare the voltages at the two inputs, and output a high or low state depending upon which of the two input signals has a greater voltage. As both reference voltage signal 250 and VCO control signal 150 are voltage signals, reference to comparing these signals refers to comparing the voltage level of reference voltage signal 250 with the voltage of VCO control signal 150. As such, reference to increasing or decreasing either reference voltage signal 250 and/or VCO control signal 150 refers to increasing or decreasing the voltage of such signal(s).

Accordingly, comparator 285 can compare VCO control signal 150 with reference voltage signal 250 and generate comparison signal 295, which indicates the greater of the two signals. Logic block 290 can receive comparison signal 295 from comparator 285 and output an increment or decrement command to counter 296. When VCO control signal 150 is greater than reference voltage signal 250, logic block 290 can increment the count within counter 296. Incrementing counter 296 can change the resistor ladder 220 input that is passed by multiplexer 225, thereby increasing the voltage of reference voltage signals 230 and 250 by one step. In this manner, controller 215 can continue to stepwise increase reference voltage signal 250 until comparison signal 295 changes state. Thus, the state of comparison signal 295 indicates which of reference voltage signal 250 or VCO control signal 150 is greater. Further, tracking transitions of comparison signal 295 indicates whether reference voltage signal 250 was initially less than VCO control signal 150 and was increased to exceed VCO control signal 150 or whether reference voltage signal 250 initially exceeded VCO control signal 150 and was reduced to become less than VCO control signal 150. The "count" stored within counter 296 is referred to within this specification, from time-to-time, as the "value" of counter 296 or as a "count value." As such, the terms and/or phrases "count," "value of the counter," and "count value" are synonymous.

When reference voltage signal 250 exceeds VCO control signal 150, provided by charge pump 110, logic block 290 can store the value, e.g., the count, of counter 296 occurring immediately prior to reference voltage signal 250 exceeding VCO control signal 150. The value of counter 296, as noted, indicates the voltage level of reference voltage signals 230 and 250. That value can be stored in memory 294. It should be noted that storage of the value of counter 296 occurs only when comparison signal 295 indicates a change of state where reference voltage signal 250 has transitioned from being less than VCO control signal 150 to exceeding VCO control signal 150. Responsive to such a transition, the value of the counter, corresponding to a voltage level of reference voltage signal 230 immediately prior to the state change, is stored. The value that is stored corresponds to a voltage level that is less than the voltage of VCO control signal 150. When comparison signal 295 indicates a further state change where reference voltage signal 250 transitions from exceeding VCO control signal 150 to being less than VCO control signal 150, no value is stored in memory 294.

Continuing, logic block 290 can begin adjusting counter 296 to track VCO control signal 150. When reference voltage signal 250 exceeds VCO control signal 150, logic block 290 can decrement counter 296, thereby causing reference voltage signal 250 to decrease by one step. When VCO control signal 150 exceeds reference voltage signal 250, logic block 290 can increment counter 296, thereby causing reference voltage signal 250 to be increased by one step. Responsive to each state change in comparison signal 295 indicating that reference voltage signal 250 has transitioned from being less than VCO control signal 150 to exceeding VCO control signal 150, logic block 290 can store the value of the counter 296 that occurred immediately prior to the state change, e.g., the value of counter 296 representing the last voltage of reference signal 250 that did not exceed VCO control signal 150.

Responsive to clock loss signal 299 signaling a loss of reference clock signal 135, logic block 290 can disconnect charge pump 110 from the input of VCO 125. Additionally, logic block 290 can recall the last stored value of counter 296 from memory 294. Logic block 290 can set counter 296 to that recalled value, thereby providing control signal 298 to multiplexer 225. Control signal 298 will cause multiplexer 225 to output reference voltage signal 230 with a voltage corresponding to the recalled value now loaded into counter 296. Logic block 290 further can enable output stage 210. This causes a voltage level, corresponding to the value recalled from memory 294, for reference voltage signal 230 to be provided to VCO 125 in the form of VCO control signal 150.

The last stored value of counter 296 indicates a voltage level for reference voltage signal 230 that is the closest incremental voltage level of reference voltage signal 230 to VCO control signal 150 that does not exceed the voltage of VCO control signal 150 immediately prior to loss of reference clock signal 135. Applying the voltage level derived from the recalled counter value as VCO control signal 150 can result in the frequency the PLL output signal 155 from VCO 125 being approximately equal to, but less than, the frequency of PLL output signal 155 immediately prior to the loss of reference clock signal 135. By applying a voltage to the input of VCO 125 that does not exceed the last known voltage of VCO control signal 150 during regular operation ensures that the frequency of the PLL output signal does not overdrive or overclock any system connected thereto.

Responsive to clock loss signal 299 indicating a return of reference clock signal 135, logic block 290 can disable output stage 210 and reconnect charge pump 110 to the input of VCO 125. Reference voltage generator 115 no longer provides VCO control signal 150 to VCO 125, but continues to monitor VCO control signal 150, now provided by charge pump 110, through node 175. Reference voltage generator 115 can continue to adjust reference voltage signals 230 and 250, and store values in memory 294, as described, in anticipation of a further loss of reference clock signal 135.

Figure 3:
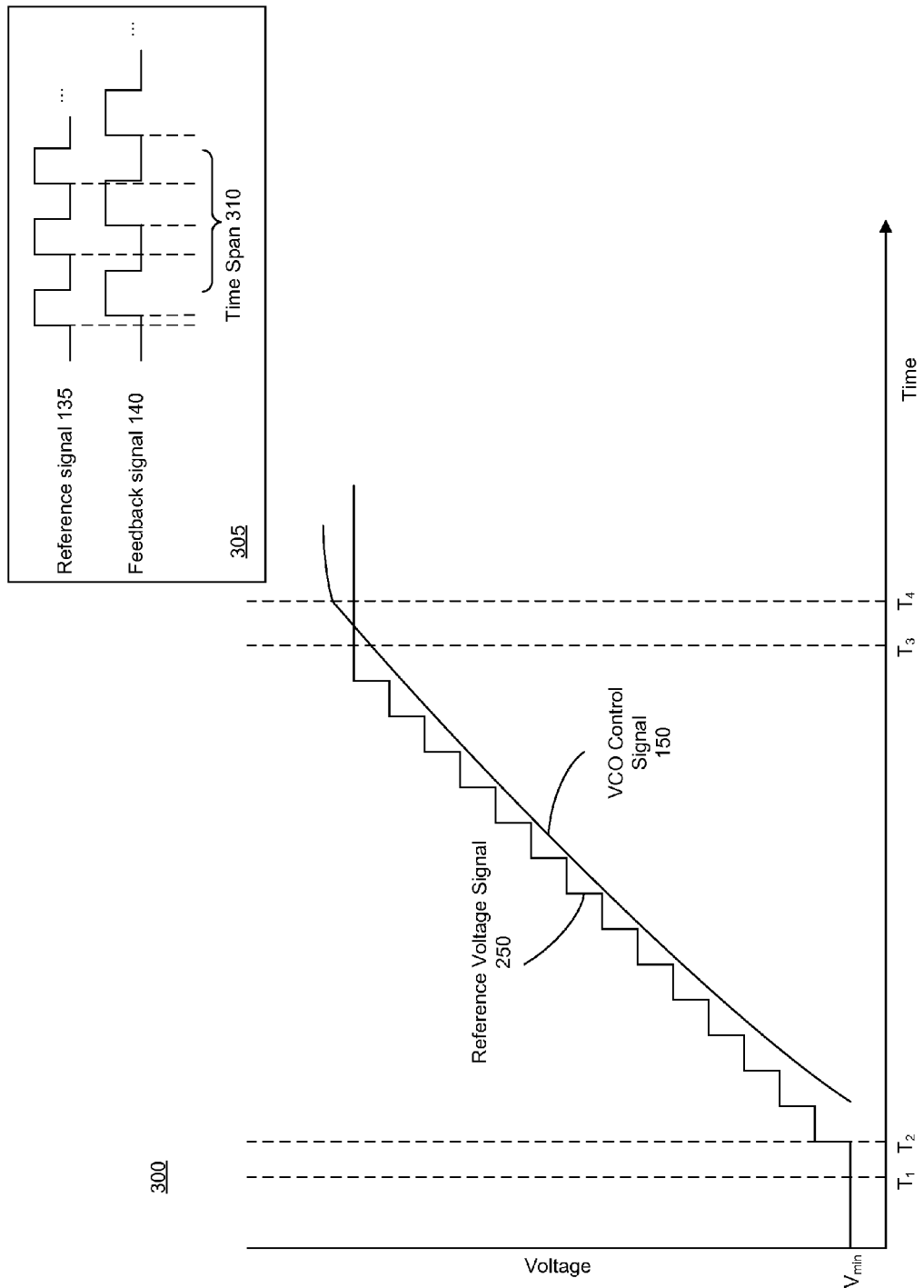
FIG. 3 is a first graph illustrating startup behavior of the PLL system of FIGS. 1 and 2 in accordance with another embodiment of the present invention.

FIG. 3 is a first graph 300 illustrating signal changes during startup of the PLL system described with reference to FIGS. 1 and 2 in accordance with another embodiment of the present invention. Graph 300 illustrates the relationship between reference voltage signal 250 and VCO control signal 150. Graph 300 illustrates how the voltage provided by reference voltage signal 250 can stepwise increase during startup of the PLL system. Within graph 300, the vertical axis represents voltage and the horizontal axis represents time.

At time $T_1$, the output stage of the reference voltage generator can connect to the input of the VCO 125, generating VCO control signal 150. Within the reference voltage generator, reference voltage signal 250 can be generated as described and initialized at a predetermined minimum voltage, e.g., $V_{min}$. Additionally, the reference voltage generator can begin monitoring the frequency differential between reference clock signal 135 and feedback signal 140.

At time $T_2$, reference voltage signal 250 can begin stepwise increasing by predetermined amounts of voltage. The output stage of the reference voltage generator can begin sourcing current to the input of the VCO, thereby increasing VCO control signal 150 to a same voltage as reference voltage signal 250. As the reference voltage generator must source current to the input of the VCO to increase VCO control signal 150, the voltage change in VCO control signal 150 lags reference voltage signal 250. In addition, VCO control signal 150 may be smoothed as a result of filtering effects provided by any loop filter connected to the input of the VCO. As reference voltage signal 250 stepwise increases, the reference voltage generator can continue to monitor the frequency differential between reference clock signal 135 and feedback signal 140 to determine when the convergence criterion is met.

At time $T_3$, the convergence criterion has been met and the stepwise increases of reference voltage signal 250 can cease. The output stage of the reference voltage generator can be disconnected from the input of the VCO. The operational voltage source can be connected to the input of the VCO and generate VCO control signal 150. As a result of the change of source at the input of the VCO, control of the frequency of the PLL output signal moves from the reference voltage generator to the operational voltage source. As used herein, an "operational voltage source" can refer to any PFD, PFD and charge pump combination, or alternate signal source used within a PLL system to provide a control voltage to the VCO during closed loop feedback operation. Applying reference voltage signal 250 to the input of the VCO means that reference voltage signal 250 controls the frequency of the PLL output signal.

Block 305 illustrates the conditions necessary for determining that the convergence criterion has been met at time $T_3$. In describing the convergence criterion, the rising edge of each of reference clock signal 135 and feedback signal 140 is the selected edge, e.g., the "transition" edge. Within block 305, time span 310 represents two consecutive clock periods of reference clock signal 135. Time span 310 represents a minimum amount of time within which the convergence criterion can occur. During time span 310, alternating transition edges occur with respect to reference clock signal 135 and feedback signal 140. That is, before detecting a second consecutive transition edge in reference clock signal 135, a transition edge in feedback signal 140 is detected. The convergence criterion can specify that two consecutive transition edges of reference clock signal 135 may not occur without an intervening transition edge occurring on feedback signal 140. To meet this condition, the convergence criterion requires that the frequency of feedback signal 140 be greater than approximately ½, e.g., 50%, of the frequency of reference clock signal 135. It should be appreciated that while a rising edge was used as the transition edge for purposes of illustration, a falling edge also may be used.

At time $T_4$, startup of PLL system 100 can complete with the feedback loop controlling the voltage at the VCO input. Subsequent to $T_4$, the PLL system can achieve phase and frequency lock, stabilizing VCO control signal 150 and the frequency of the PLL output signal. The present embodiment uses a convergence criterion that closes the feedback loop of the PLL system responsive to the frequency of feedback signal 140 being at least 50% of the frequency of reference clock signal 135. The convergence criterion, however, can be set to different percentages of the frequency of reference clock signal 135, e.g., 60%, 70%, 75%, or the like. As such, the particular metric used for the convergence criterion is not intended to limit the embodiments described within this specification.

Figure 4:
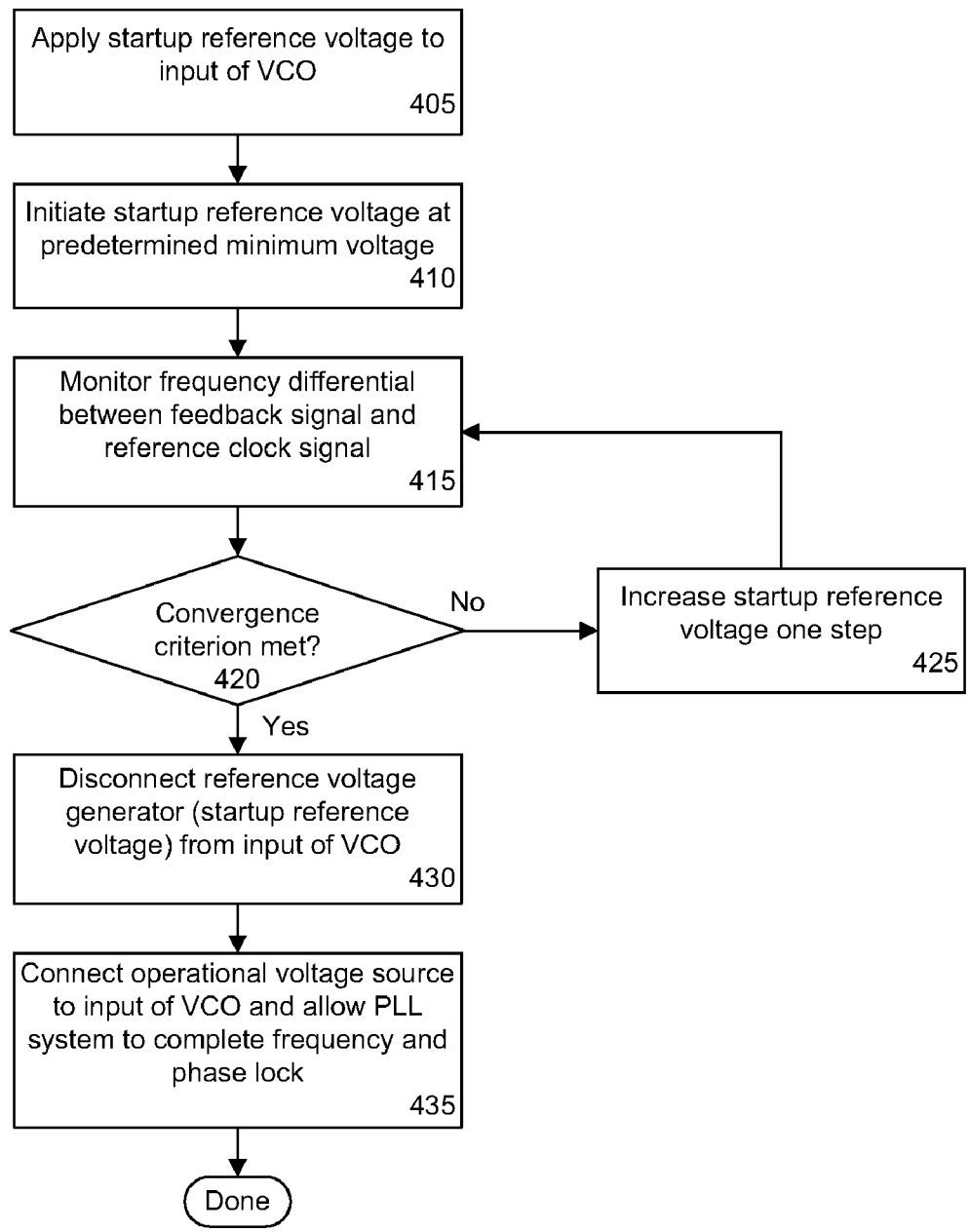
FIG. 4 is a first flow chart illustrating a method of startup of the PLL system of FIGS. 1-3 in accordance with another embodiment of the present invention.

FIG. 4 is a first flow chart illustrating a method 400 of startup of the PLL system described with reference to FIGS. 1-3, in accordance with another embodiment of the present invention. Method 400 can begin in a state where the operational voltage source of the PLL system is not connected to the VCO. The reference voltage generator can be connected to the VCO to supply the VCO control signal as described. It should be appreciated that the PLL system can start up in this state or that upon startup, the operational voltage source can be disconnected with the reference voltage generator being connected in place of the operational voltage source. As noted, disconnecting the operational voltage source opens the feedback loop of the PLL system.

Accordingly, in step 405, a startup reference voltage can be provided from the reference voltage generator to the input of the VCO of the PLL system. In step 410, the PLL system can initiate or set the startup reference voltage to a predetermined minimum voltage. The minimum voltage of the startup reference voltage can be fixed by the PLL system, e.g., 50 mV, or can be programmable by the user, e.g., selectable in 50 mV intervals above the lowest voltage source supplying the PLL system. When the minimum voltage is programmable, a user can set the minimum voltage to a value that optimizes the startup of the PLL system.

In step 415, the PLL system can monitor a frequency differential between the feedback signal and a reference signal provided to the PLL system. Typically, monitoring of the frequency differential can entail detecting the transition edges of each of the feedback signal and the reference signal. The number of times the transition edge is detected on each signal per unit of time or the relative phase difference between occurrences of the transition edges of each signal can be used to determine a frequency differential between the feedback signal and the reference signal.

In decision box 420, the PLL system can determine whether a convergence criterion is met. The convergence criterion can be determined by counting the occurrences of the transition edges of the feedback signal and the reference signal. The convergence criterion can be met when the transition edge of the reference signal alternates with the transition edge of the feedback signal for two consecutive periods of the reference signal. That is, when the following sequence is detected, the convergence criterion is met: transition edge of reference signal, transition edge of feedback signal, transition edge of reference signal. Thus, the convergence criterion is not met so long as two consecutive transition edges of the reference signal are detected without an intervening transition edge of the feedback signal. As noted, falling edges may be used as the transition edge in lieu of rising edges. Alternatively, one of the signals may have a rising transition edge while the other signal has a falling transition edge.

When the convergence criterion is met, the method can proceed to step 430. When the convergence criterion is not met, the method can proceed to step 425. In step 425, the reference voltage generator can increase the startup reference voltage provided to the VCO by one step and continue monitoring the frequency differential between the reference signal and the feedback signal. As the startup reference voltage increases, the frequency of the PLL output signal increases. Additionally, as the feedback signal to the PFD is generated from the PLL output signal, a frequency increase in the PLL output signal causes a proportional increase in the frequency of the feedback signal.

Continuing with step 430, where the convergence criterion has been met, the PLL system can remove the startup reference voltage from the input of the VCO by disconnecting the reference voltage generator. The removal of the startup reference voltage from the input of the VCO terminates control over the frequency of the PLL output signal by the reference voltage generator.

In step 435, the PLL system can connect the operational voltage source to the input of the VCO and allow the PLL system to complete phase and frequency lock. Connecting the operational voltage source to the input of the VCO closes the PLL feedback loop and returns control of the frequency of the PLL output signal to the closed loop response of the PLL system. The PLL system continues to operate to achieve phase and frequency lock.

Figure 5:
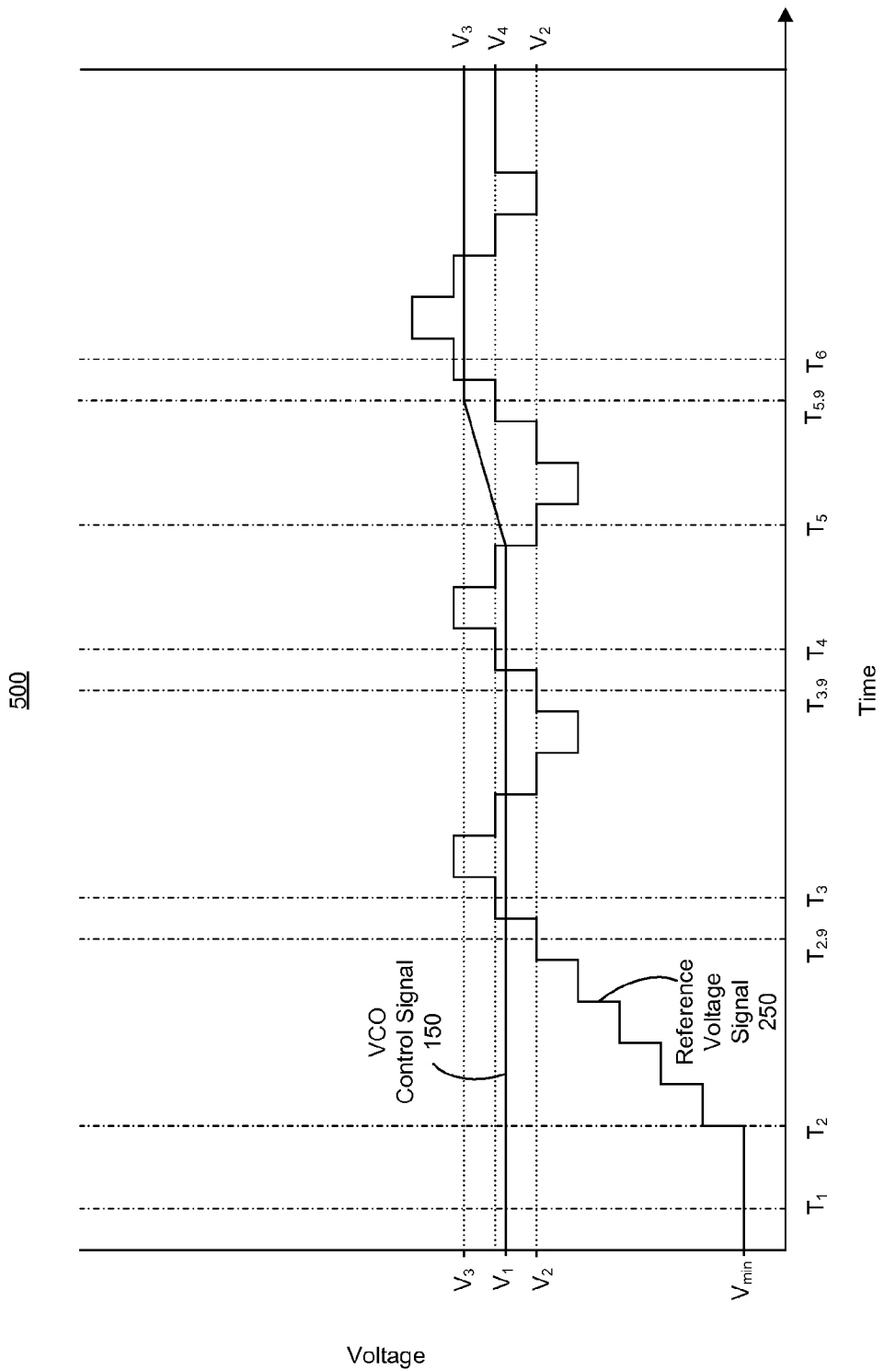
FIG. 5 is a second graph illustrating operation of the PLL system of FIGS. 1 and 2 after acquisition of phase and frequency lock in accordance with another embodiment of the present invention.

FIG. 5 is a second graph 500 illustrating operation of the PLL system described with reference to FIGS. 1 and 2 after acquisition of phase and frequency lock, in accordance with another embodiment of the present invention. More particularly, graph 500 illustrates the manner in which reference voltage signal 250 tracks the movement of VCO control signal 150 over time. Within graph 500, the vertical axis represents voltage and the horizontal axis represents time.

At time $T_1$, the PLL system can be in phase and frequency lock. VCO control signal 150 can reflect a steady state voltage of $V_1$. Reference voltage signal 250 can be initialized at the minimum voltage of $V_{min}$. The minimum voltage $V_{min}$, for example, can be the same voltage as the initial startup voltage used and described with reference to FIG. 3. The feedback loop of the PLL system is closed and the operational voltage source controls the VCO.

At time $T_2$, the reference voltage generator can begin to stepwise increase reference voltage signal 250 from $V_{min}$. In one embodiment the timing of the stepwise increase can be a clocked event, with each step occurring over one period of a clock input to the reference voltage generator. The frequency of such a clock may or may not be the same as the frequency of the reference signal previously described. Subsequent to each stepwise increase of reference voltage signal 250, the reference voltage generator can determine that the voltage of reference voltage signal 250 is less than $V_1$, e.g., the voltage level of VCO control signal 150. Responsive to determining that reference voltage signal 250 is less than $V_1$, reference voltage signal 250 can be increased by one step. As noted, this corresponds to incrementing the counter within the controller portion of the reference voltage generator.

At time $T_3$, the reference voltage generator can determine that the voltage of reference voltage signal 250 exceeds the voltage of VCO control signal 150. Responsive to determining that reference voltage signal 250 has transitioned from being less than VCO control signal 150 at time $T_{2.9}$ to being greater than VCO control signal 150 at time $T_3$, the reference voltage generator can store, within memory, the value of the counter occurring at time $T_{2.9}$, which corresponds to a voltage of $V_2$ for reference voltage signal 250. The counter value that is stored corresponds to a voltage level of reference voltage signal 250 that occurred immediately prior to reference voltage signal 250 exceeding VCO control signal 150. Accordingly, the counter value indicating $V_2$ that is stored at time $T_3$ is the last stored value that is available for subsequent recall in the event the reference signal to the PLL system is lost.

At time $T_4$, a same set of conditions can occur as at time $T_3$. Specifically, the reference voltage generator can determine that reference voltage signal 250 has transitioned from being less than VCO control signal 150 at time $T_{3.9}$ to exceeding VCO control signal 150 at time $T_4$. Accordingly, the reference voltage generator can store, within memory, the value of the counter occurring at time $T_{3.9}$. That is, the counter value corresponding to $V_2$ occurring at time $T_{3.9}$ can be stored in memory. The counter value indicating the voltage $V_2$ that is stored at time $T_4$ can become the last stored value available for subsequent recall in the event the reference signal to the PLL system is lost.

At time $T_5$, the reference voltage generator can detect a state transition in which reference voltage signal 250 becomes less than VCO control signal 150. Time $T_5$ illustrates the opposite case previously illustrated at times $T_3$ and $T_4$. At time $T_5$, the reference voltage generator does not store any counter value in memory. If a new value was stored in memory at time $T_5$, the counter value stored would represent a voltage level for reference voltage signal 250 that exceeded VCO control signal 150. Were such a voltage level to be applied to the VCO, the PLL output signal would likely exceed the desired output frequency of the PLL system and cause instability in any system driven by the PLL output signal.

Continuing with FIG. 5, the voltage level of VCO control signal 150 can begin to shift at or around time $T_5$. For any of a variety of different reasons, VCO control signal 150 can begin to shift upward until VCO control signal 150 stabilizes at voltage $V_3$. Reference voltage signal 250 can begin to stepwise increase, tracking the voltage changes of VCO control signal 150.

At time $T_6$, the reference voltage generator can determine that again reference voltage signal 250 has transitioned from a state in which reference voltage signal is less than VCO control signal 150 at time $T_{5.9}$ to a state in which reference voltage signal 250 exceeds VCO control signal 150 at time $T_6$. Accordingly, the counter value occurring at time $T_{5.9}$ corresponding to voltage V4 of reference voltage signal 250 can be stored in memory. The counter value corresponding to $V_4$ that is stored at time $T_6$ can become the last stored counter value available for subsequent recall in the event the reference signal to the PLL system is lost.

Figure 6:
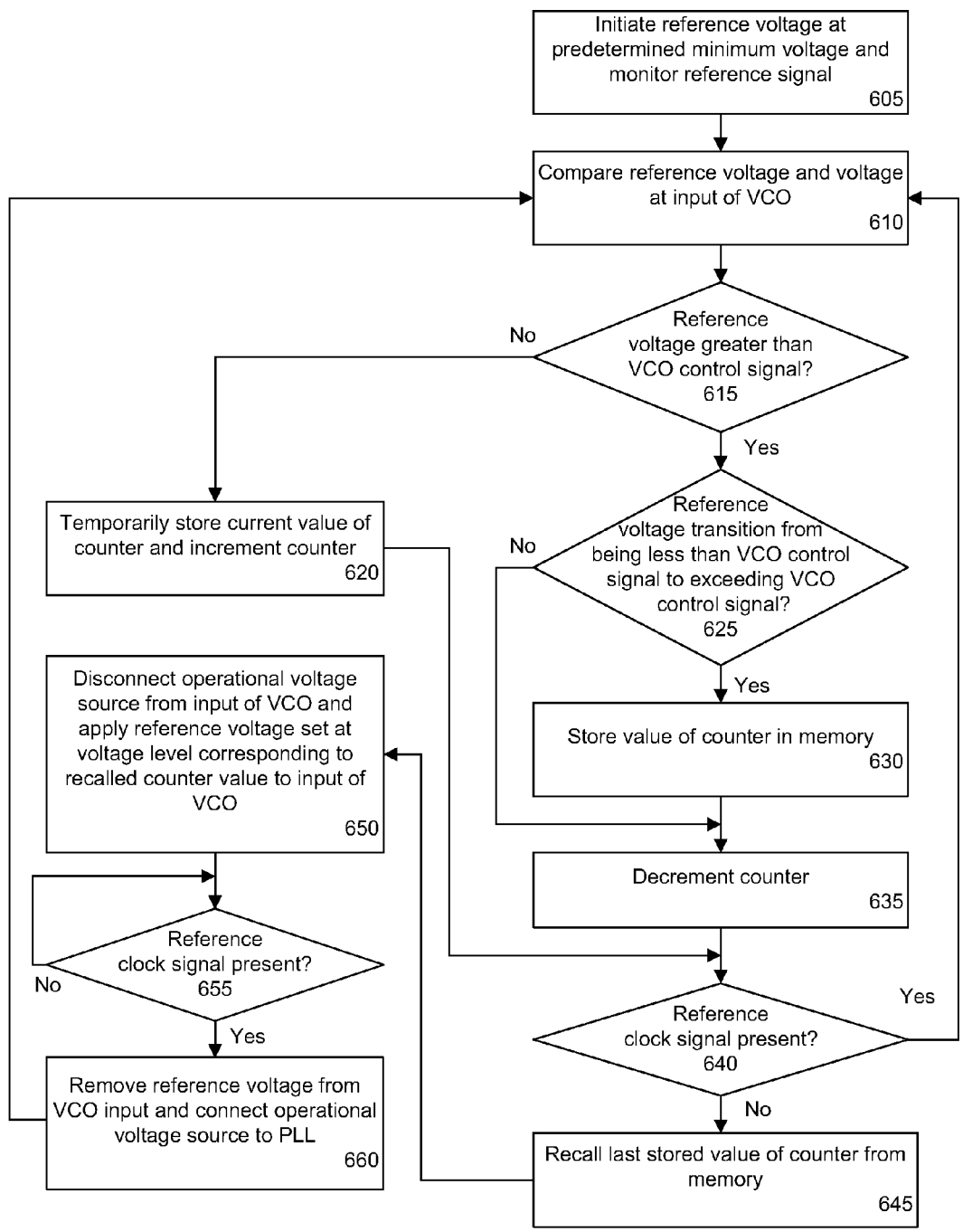
FIG. 6 is a second flow chart illustrating a method of maintaining frequency of an output signal of the PLL system of FIGS. 1, 2, and 5 upon loss of a reference signal in accordance with another embodiment of the present invention.

FIG. 6 is a second flow chart illustrating a method 600 of maintaining an output frequency of the PLL system described with reference to FIGS. 1, 2, and 5 responsive to the loss of the reference signal, in accordance with another embodiment of the present invention. Method 600 can begin with the PLL system having achieved phase and frequency lock and the input to the VCO having reached a stable level of control voltage. In addition, the operational voltage source, e.g., charge pump, can be generating the VCO control signal to the input of the VCO.

Accordingly, in step 605, the PLL system can initiate the reference voltage at a predetermined minimum voltage and begin monitoring for a presence of the reference signal. The reference signal is a benchmark signal, e.g., a clock signal, to which the PLL system phase and frequency locks. Typically, the frequency of the PLL output signal is a multiple of the frequency of the reference signal. Accordingly, a loss of the reference signal typically results in a conventional PLL losing lock and an inability to predict the frequency of the PLL output signal.

In step 610, using a comparator, the PLL system can compare the reference voltage with the voltage at the input of the VCO, e.g., the VCO control signal. In step 615, the PLL system can determine, via the comparator, whether the reference voltage is greater than the voltage at the VCO control signal. When the reference voltage is greater than the VCO control signal, the method can proceed to step 625. When the reference voltage is not greater than the VCO control signal, the method can proceed to step 620. In step 620, the PLL system can temporarily store the counter value corresponding to the current reference voltage and then increment the counter, thereby increasing the reference voltage by a predetermined amount. After step 620, the method can proceed to step 640.

Continuing with step 625, a determination can be made as to whether the reference voltage has risen from a level below the VCO control signal to a level that exceeds the VCO control signal. If the comparison signal from the comparator has transitioned in a manner that indicates this condition, the method can proceed to step 630. If not, the method can proceed to step 635, where the counter can be decremented, thereby decreasing the reference voltage by one step.

In step 630, the value of the counter can be stored in memory for subsequent recall. The value of the counter that is stored will correspond to the last incremental value of the reference voltage that did not exceed the VCO control signal. In step 635, the counter can be decremented, thereby decreasing the reference voltage by one step. Continuing to step 640, the PLL system can determine whether the reference signal is still present, e.g., detected. If so, the method can loop back to step 610. If not, the method can continue to step 645.

In step 645, when the reference signal is not detected, or is otherwise unavailable, the counter value stored in memory in step 630 can be recalled from memory. In step 650, the PLL system can disconnect the operational voltage source from the input of the VCO and connect the reference voltage generator to the input of the VCO. The reference voltage generator will apply the reference voltage, set to a voltage level corresponding to the recalled counter value, to the input of the VCO. As such, control of the VCO is taken from the operational voltage source and provided to the reference voltage generator. As noted, the reference voltage generator provides the VCO control signal in lieu of the operational voltage source. In this manner, the applied reference voltage can maintain the frequency of the PLL output signal at a level approximately equal to the frequency of the PLL output signal just prior to the loss of the reference signal.

In step 655, the PLL system can determine whether the reference signal is present. When the reference signal is present, the method can proceed to step 660. When the reference signal is not present, the method can return to step 655 and can continue monitoring for the presence of the reference signal. In step 660, the PLL system can disconnect the reference voltage generator from the input of the VCO and connect the operational voltage source to the input of the VCO. Accordingly, the operational voltage source now provides the VCO control signal in lieu of the reference voltage generator. In this mode, the PLL system can return to closed loop operation and proceed to step 610.

The flowcharts in the figures illustrate the architecture, functionality, and operation of possible implementations of circuits, systems, methods, and computer program products according to various embodiments of the present invention. In this regard, each block in the flowcharts may represent a module, segment, or portion of code, which comprises one or more portions of computer-usable program code that implements the specified logical function(s).

For example, the embodiments disclosed within this specification may be implemented as one or more intellectual property (IP) cores that may be available for use within larger system. An IP core can include a predetermined set of configuration bits that program a programmable IC to perform one or more functions. Alternatively, an IP core can include source code or schematics that describe the logic and connectivity of a design. Some cores include an optimally floor-planned layout targeted to a specific family of programmable ICs. IP cores can also be parameterizable, i.e., allowing the user to enter parameters to activate or change certain core functionality.

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

Embodiments of the present invention can be realized in hardware, software, or a combination of hardware and software. Any kind of data processing system or other apparatus adapted for carrying out the methods described herein is suited. A typical combination of hardware and software can be a general-purpose computer system with a computer program that, when being loaded and executed, controls the computer system such that it carries out the methods described herein or is capable of instantiating a circuit design specified in programmatic form within an IC, whether programmable or not.

A "computer," e.g., a data processing system or a computer system, suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices such as, for example, keyboards, displays, pointing devices, etc., can be coupled to the computer either directly or through intervening I/O controllers. Network adapters may also be coupled to the computer to enable the computer to become coupled to other computers, devices, or remote printers or storage devices through intervening private or public networks. Modems, cable modems, and Ethernet cards are just a few of the currently available types of network adapters.

Embodiments of the present invention further can be embedded in a computer program product, which comprises all the features enabling the implementation of the methods described herein. The computer program product can include a computer-usable or computer-readable medium having computer-usable program code which, when loaded in a computer system, specifies, or causes the computer system to generate, a programmatic description of the circuits and/or systems described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," and variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library, a netlist, an IP core, a hardware description language specification of a system, a bitstream, and/or other sequence of instructions designed for execution on a computer system or which programs an IC, or implements within an IC, the embodiments described within this specification.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A method of startup for a phase-locked loop (PLL), the method comprising:
    at initiation of the PLL, providing a reference voltage from a startup voltage source to an input of a voltage controlled oscillator (VCO) in the PLL, wherein the reference voltage is set to a predetermined minimum voltage;
    stepwise increasing the reference voltage from the predetermined minimum voltage;
    comparing a frequency of a reference signal input to the PLL with a frequency of a feedback signal originating from an output of the VCO of the PLL to determine a frequency differential as the reference voltage increases;
    determining whether a convergence criterion is met according to the frequency differential;
    while the convergence criterion is not met, increasing the reference voltage; and
    when the convergence criterion is met, replacing the reference voltage provided by the startup voltage source with an operational voltage generated by an operational voltage source.

2. The method of claim 1, wherein providing a reference voltage from a startup voltage source further comprises:
    operationally disconnecting an output of the operational voltage source from the input of the VCO; and
    operationally connecting an output of the startup voltage source to the input of the VCO.

3. The method of claim 1, further comprising determining that the convergence criterion is not met responsive to detecting at least two consecutive transition edges of the reference signal without detecting an intervening transition edge of the feedback signal.

4. The method of claim 1, further comprising determining that the convergence criterion is met when transition edges of the reference signal and the feedback signal alternate for two consecutive periods of the reference signal.

5. The method of claim 1, wherein replacing the reference voltage provided by the startup voltage source with the operational voltage generated by the operational voltage source further comprises:
    operationally disconnecting an output of the startup voltage source from the input of the VCO; and
    operationally connecting an output of the operational voltage source to the input of the VCO.

6. The method of claim 1, wherein the PLL is in phase and frequency lock, the method comprising:
    comparing the operational voltage at the input of the VCO with the reference voltage, wherein the reference voltage is set to the predetermined minimum voltage;
    dynamically, stepwise adjusting the reference voltage in increments of a predetermined quantity of voltage according to the comparing of the operational voltage with the reference voltage; and
    storing, in memory, a counter value representing the reference voltage that occurs immediately prior to the reference voltage being stepwise adjusted to exceed the operational voltage.

7. The method of claim 6, further comprising:
    responsive to detecting a loss of the reference signal to the PLL, recalling the counter value from memory;
    setting the reference voltage to a voltage level indicated by the recalled counter value; and
    replacing the operational voltage provided to the input of the VCO with the reference voltage.

8. A phase-locked loop (PLL) system comprising a voltage controlled oscillator (VCO) and a voltage reference generator, wherein the reference voltage generator comprises:
    a reference voltage source that, at initiation of the PLL system, generates a reference voltage set to a predetermined minimum voltage that is provided to an input of the VCO in the PLL system; and
    a controller that stepwise increases the reference voltage of the reference voltage source, compares a frequency of a reference signal provided to the PLL system with a frequency of a feedback signal originating from an output of the VCO, calculates a frequency differential between the reference signal and the feedback signal as the reference voltage increases, and determines whether a convergence criterion is met according to the frequency differential,
    wherein, when the convergence criterion is met, the controller disconnects the reference voltage source from the input of the VCO and connects an operational voltage source to the input of the VCO.

9. The system of claim 8, wherein, at startup of the PLL system, the controller opens a feedback loop of the PLL system by connecting the reference voltage source to the input of the VCO in lieu of the operational voltage source.

10. The system of claim 9, wherein the controller operationally disconnects an output of the operational voltage source from the input of the VCO and operationally connects an output of the reference voltage generator to the input of the VCO.

11. The system of claim 8, wherein the controller comprises:
    a counter providing a control signal to the reference voltage source controlling the reference voltage output from the reference voltage source; and
    a logic block periodically incrementing the counter, thereby stepwise increasing the reference voltage.

12. The system of claim 8, wherein the controller determines that the convergence criterion is not met when two consecutive transition edges are detected in the reference signal without detecting an intervening transition edge in the feedback signal.

13. The system of claim 8, wherein the controller determines that the convergence criterion is met when transition edges of the reference signal and the feedback signal alternate for two consecutive periods of the reference signal.

14. A phase-locked loop (PLL) system, comprising:
an operational voltage source that generates an operational voltage that is provided to an input of a voltage controlled oscillator (VCO) of the PLL system during phase and frequency lock of the PLL system;
a reference voltage source generating a reference voltage; and
a controller that, while the PLL system is in phase and frequency lock, determines whether a reference signal to the PLL system is available and controls the reference voltage source to generate the reference voltage approximating the operational voltage from the operational voltage source, wherein the controller selectively stores a count value, indicating the reference voltage, in memory,
wherein, responsive to determining that the reference signal is unavailable, the controller operationally disconnects the operational voltage source from the input of the VCO, recalls the count value from memory, controls the reference voltage source to generate the reference voltage having a voltage corresponding to the recalled count value, and operationally connects the reference voltage source to the input of the VCO.

15. The PLL system of claim 14, wherein, responsive to determining that the reference signal is available, the controller operationally disconnects the reference voltage source from the input of the VCO and operationally connects the operational voltage source to the input of the VCO.

16. The PLL system of claim 14, wherein, responsive to determining that the reference signal is unavailable, the controller opens a feedback loop of the PLL system by connecting the reference voltage source to the input of the VCO in lieu of the operational voltage source.

17. The PLL system of claim 14, wherein the controller comprises a comparator that compares the operational voltage generated by the operational voltage source at the input of the VCO during phase and frequency lock of the PLL system with the reference voltage generated by the reference voltage source.

18. The PLL system of claim 17, wherein the controller comprises a logic block and a counter maintaining the count value, wherein responsive to a comparison signal generated by the comparator, the logic block decrements the count value of the counter when the reference voltage exceeds the operational voltage and increments the count value of the counter when the operational voltage exceeds the reference voltage.

19. The PLL system of claim 18, wherein the counter outputs a control signal causing the reference voltage source to increase the reference voltage or decrease the reference voltage according to the count value.

20. The PLL system of claim 14, wherein the controller, responsive to determining that the reference voltage has transitioned from a first voltage level less than the operational voltage to a second voltage level exceeding the operational voltage, stores the count value corresponding a the first voltage level in memory.

\* \* \* \* \*